(12) United States Patent
Ramaraju

(10) Patent No.: US 7,495,493 B2
(45) Date of Patent: Feb. 24, 2009

(54) CIRCUITRY FOR LATCHING

(75) Inventor: Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 238 days.

(21) Appl. No.: 11/468,521

(22) Filed: Aug. 30, 2006

(65) Prior Publication Data

US 2008/0054975 A1    Mar. 6, 2008

(51) Int. Cl.
*H03K 3/356* (2006.01)

(52) U.S. Cl. .................. 327/211; 327/212; 327/214; 327/218; 327/225

(58) Field of Classification Search .......... 327/199–225
See application file for complete search history.

(56) References Cited

U.S. PATENT DOCUMENTS

| | | | | |
|---|---|---|---|---|
| 4,779,011 A | * | 10/1988 | Tsunoi et al. ............... 327/225 |
| 5,144,158 A | * | 9/1992 | Kanai et al. ................. 327/199 |
| 5,598,120 A | * | 1/1997 | Yurash ....................... 327/202 |
| 5,818,274 A | * | 10/1998 | Lombreschi et al. ........ 327/217 |
| 6,002,285 A | * | 12/1999 | Muhich et al. .............. 327/208 |
| 6,469,953 B1 | | 10/2002 | Hong |
| 7,242,235 B1 | * | 7/2007 | Nguyen ....................... 327/210 |
| 7,388,416 B2 | * | 6/2008 | Marutani ..................... 327/201 |
| 2005/0116756 A1 | | 6/2005 | Kim |

* cited by examiner

*Primary Examiner*—Lincoln Donovan
*Assistant Examiner*—William Hernandez
(74) *Attorney, Agent, or Firm*—Susan C. Hill

(57) ABSTRACT

Circuitry for latching receives an input signal and a control signal and provides an output signal. In one embodiment, the setup time (t(SL) and t(SH)) of the input signal with reference to the control signal is to the first edge of the control signal, the holding time (t(HL) and t(HH)) of the input signal with reference to the control signal is independent of the second edge of the control signal, and the output signal goes to a predetermined state in response to the second edge of the control signal. In one embodiment, the control signal may be a clock. The circuitry for latching may be used with static circuits and/or with dynamic circuits.

20 Claims, 7 Drawing Sheets

US 7,495,493 B2

CIRCUITRY FOR LATCHING

FIELD OF THE INVENTION

The invention relates in general to circuitry, and in particular to circuitry for latching.

RELATED ART

For some circuit blocks that receive both a control signal and a data signal as inputs, it is necessary for the data signal to be valid for the entire duration of the assertion of the control signal in order for the circuit block to work properly. However, in some applications which use the circuit block, the data signal may be provided from a plurality of sources that have different capabilities. For example, it may be difficult or even impossible for some sources of the data signal to provide the data signal for the entire duration of the assertion of the control signal. Such a problem may arise when the sources of the data signal have different timing (e.g. use different clocks to clock their circuitry).

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the term "bus" is used to refer to a plurality of signals or conductors which may be used to transfer one or more various types of information, such as data, addresses, control, or status. The terms "assert" and "negate" are used when referring to the rendering of a signal, status bit, or similar apparatus into its logically true or logically false state, respectively. If the logically true state is a logic level one or high, the logically false state is a logic level zero or low. And if the logically true state is a logic level zero or low, the logically false state is a logic level one or high. The terms PMOS and p-channel are used interchangeably herein and refer to a p-type semiconductor device. The terms NMOS and n-channel are used interchangeably herein and refer to an n-type semiconductor device. PMOS is an abbreviation for p-channel metal oxide semiconductor, and NMOS is an abbreviation for n-channel metal oxide semiconductor.

DETAILED DESCRIPTION OF FIGURES

Figure 1:
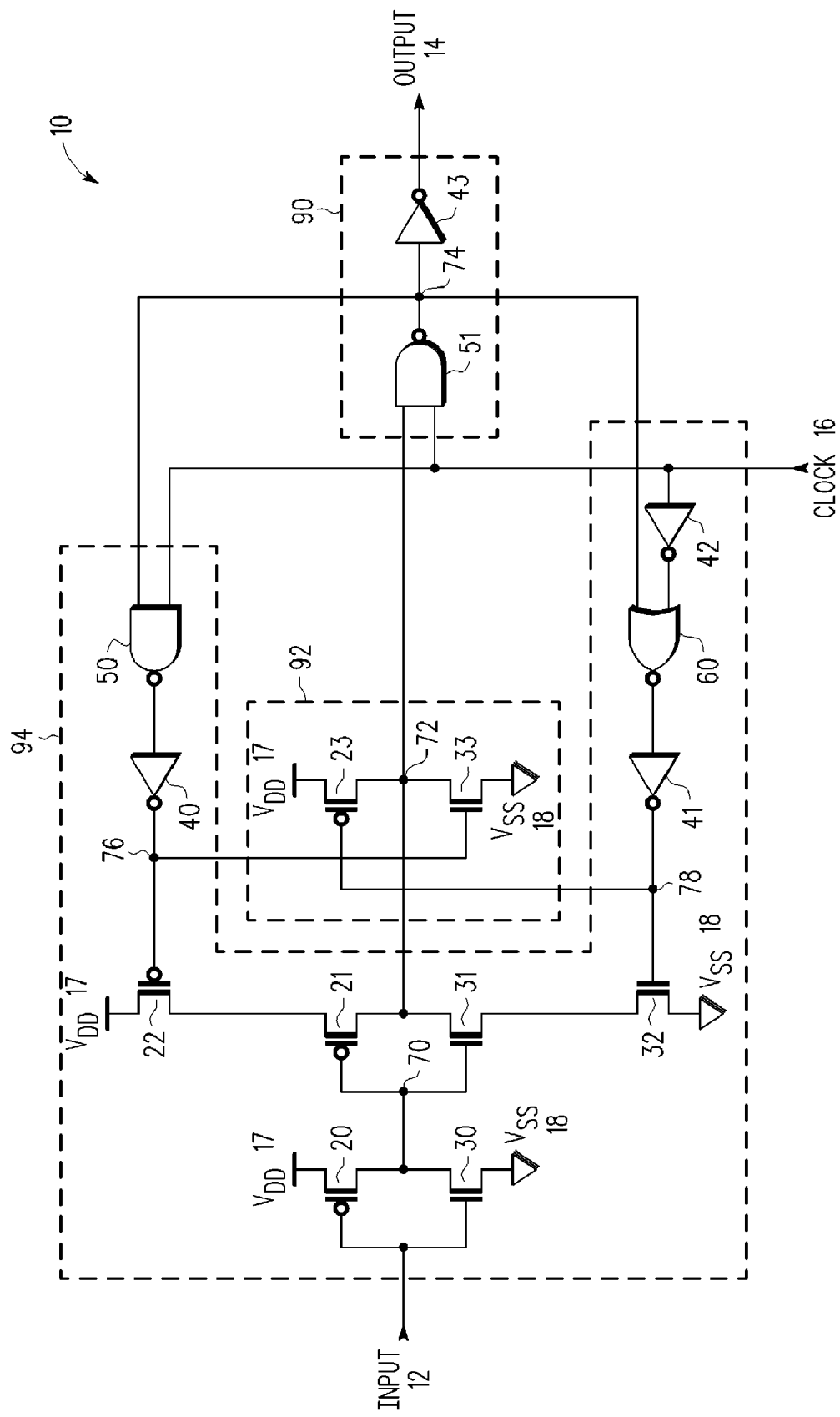
FIG. 1 illustrates, in partial schematic diagram and partial logic diagram form, a latch circuit in accordance with one embodiment.

FIG. 1 illustrates a circuit 10 receiving an input 12 and a clock 16, and providing an output 14. Input 12 is provided to a control electrode of a PMOS transistor 20 and to a control electrode of an NMOS transistor 30. A first current electrode of PMOS transistor 20 is coupled to a first power supply voltage VDD 17. A first current electrode of NMOS transistor 30 is coupled to a second current electrode of PMOS transistor 20, and a second current electrode of NMOS transistor 30 is coupled to a second power supply voltage VSS 18. The first current electrode of NMOS transistor 30 is also coupled to node 70, to a control electrode of a PMOS transistor 21, and to a control electrode of NMOS transistor 31. A first current electrode of PMOS transistor 21 is coupled to a second current electrode of a PMOS transistor 22. A first current electrode of PMOS transistor 22 is coupled to the first power supply voltage VDD 17. A first current electrode of NMOS transistor 31 is coupled to a second current electrode of PMOS transistor 21, and a second current electrode of NMOS transistor 31 is coupled to a first current electrode of NMOS transistor 32. A second current electrode of NMOS transistor 32 is coupled to the second power supply voltage VSS 18.

A control electrode of PMOS transistor 22 is coupled to a node 76, to an output of an inverting gate 40, and to a control electrode of an NMOS transistor 33. A first current electrode of NMOS transistor 33 is coupled to a second current electrode of a PMOS transistor 23 and to node 72. A first current electrode of PMOS transistor 23 is coupled to the first power supply voltage VDD 17, and a second current electrode of the NMOS transistor 33 is coupled to the second power supply voltage VSS 18. An input of inverting gate 40 is coupled to an output of a NAND gate 50. A first input of NAND gate 50 is coupled to node 74. A second input of NAND gate 50 is coupled to receive a clock signal 16. Clock signal 16 is also provided at an input of inverting gate 42. Node 74 is coupled to a first input of NOR gate 60. An output of inverting gate 42 is coupled to a second input of NOR gate 60. An output of NOR gate 60 is coupled to an input of inverting gate 41. An output of inverting gate 41 is coupled to node 78, to a control electrode of NMOS transistor 32, and to a control electrode of PMOS transistor 23. Clock 16 is also provided to a second input of a NAND gate 51. A first input of NAND gate 51 is coupled to node 72. An output of NAND gate 51 is coupled to node 74. Node 74 is also coupled to an input of inverting gate 43. An output of inverting gate 43 provides the output signal 14.

In the illustrated embodiment of FIG. 1, circuit portion 90 comprises devices 51 and 43; circuit portion 92 comprises devices 23 and 33; and circuit portion 94 comprises devices 20-22, 30-32, 40-42, 50, and 60. Alternate embodiments may implement the circuit portions in a different manner, and/or may use fewer or more circuit portions.

Figure 3:
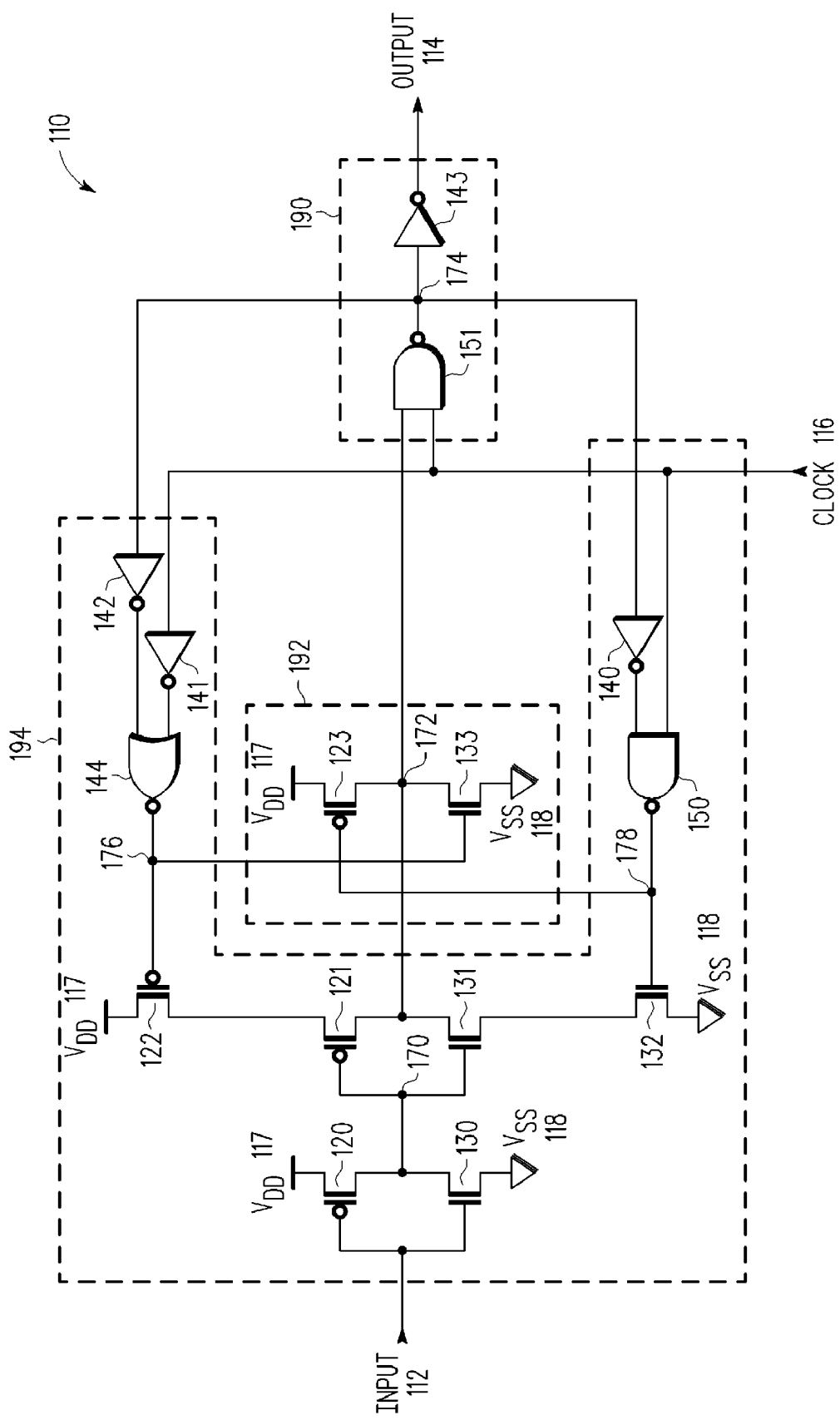
FIG. 3 illustrates, in partial schematic diagram and partial logic diagram form, a latch circuit in accordance with an alternate embodiment.

FIG. 3 illustrates a circuit 110 receiving an input 112 and a clock 116, and providing an output 114. Input 12 is provided to a control electrode of a PMOS transistor 120 and to a control electrode of an NMOS transistor 130. A first current electrode of PMOS transistor 120 is coupled to a first power supply voltage VDD 117. A first current electrode of NMOS transistor 130 is coupled to a second current electrode of PMOS transistor 120, and a second current electrode of NMOS transistor 130 is coupled to a second power supply voltage VSS 118. The first current electrode of NMOS transistor 130 is also coupled to node 170, to a control electrode of a PMOS transistor 121, and to a control electrode of NMOS transistor 131. A first current electrode of PMOS transistor 121 is coupled to a second current electrode of a PMOS transistor 122. A first current electrode of PMOS transistor 122 is coupled to the first power supply voltage VDD 117. A first current electrode of NMOS transistor 131 is coupled to a second current electrode of PMOS transistor 121, and a second current electrode of NMOS transistor 131 is coupled to a first current electrode of NMOS transistor 132. A second current electrode of NMOS transistor 132 is coupled to the second power supply voltage VSS 118.

A control electrode of PMOS transistor 122 is coupled to a node 176, to an output of a NOR gate 144, and to a control electrode of an NMOS transistor 133. A first current electrode of NMOS transistor 133 is coupled to a second current electrode of a PMOS transistor 123 and to node 172. A first current electrode of PMOS transistor 123 is coupled to the first power supply voltage VDD 117, and a second current electrode of the NMOS transistor 133 is coupled to the second power supply voltage VSS 118. A first input of NOR gate 144 is coupled to an output of an inverting gate 142. A second input of NOR gate 144 is coupled to an output of inverting gate 141. Clock signal 116 is provided at an input of inverting gate 140 and at a second input of NAND gate 150. An output of inverting gate 140 is coupled to a first input of NAND gate 150. An output of NAND gate 150 is coupled to node 178, to a control electrode of NMOS transistor 132, and to a control electrode of PMOS transistor 123. Clock signal 116 is also provided to a second input of a NAND gate 151. A first input of NAND gate 151 is coupled to node 172. An output of NAND gate 151 is coupled to node 174. Node 174 is also coupled to an input of inverting gate 143. An output of inverting gate 143 provides the output signal 114.

In the illustrated embodiment of FIG. 3, circuit portion 190 comprises devices 151 and 143; circuit portion 192 comprises devices 123 and 133; and circuit portion 194 comprises devices 120-122, 130-132, 140-142, 144, and 150. Alternate embodiments may implement the circuit portions in a different manner, and/or may use fewer or more circuit portions.

Figure 5:
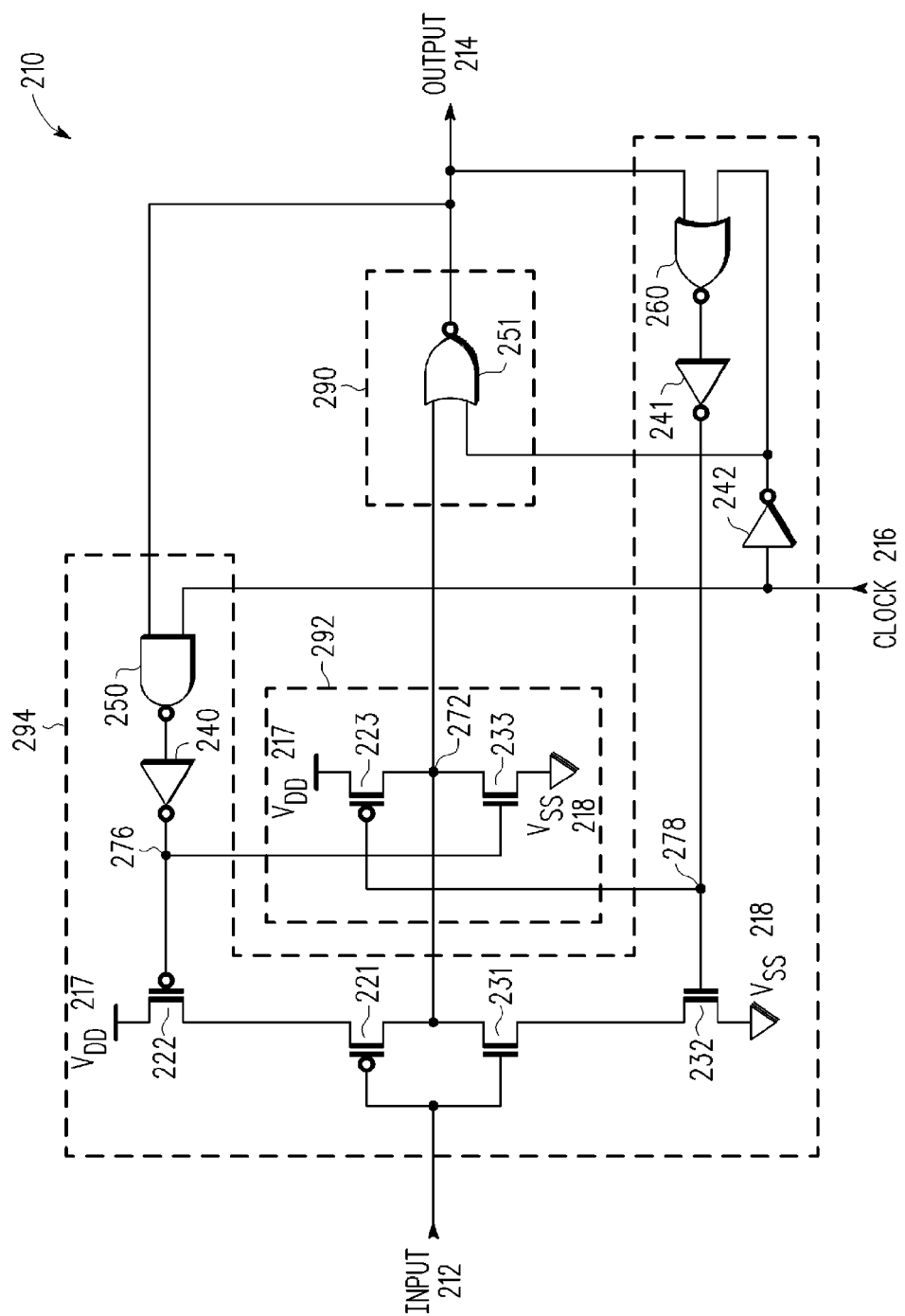
FIG. 5 illustrates, in partial schematic diagram and partial logic diagram form, a latch circuit in accordance with an alternate embodiment.

FIG. 5 illustrates a circuit 210 receiving an input 212 and a clock 216, and providing an output 214. Input 212 is provided to a control electrode of a PMOS transistor 221 and to a control electrode of an NMOS transistor 231. A first current electrode of PMOS transistor 221 is coupled to a second current electrode of a PMOS transistor 222. A first current electrode of PMOS transistor 222 is coupled to the first power supply voltage VDD 217. A first current electrode of NMOS transistor 231 is coupled to a second current electrode of PMOS transistor 221, and a second current electrode of NMOS transistor 231 is coupled to a first current electrode of NMOS transistor 232. A second current electrode of NMOS transistor 232 is coupled to the second power supply voltage VSS 218.

A control electrode of PMOS transistor 222 is coupled to a node 276, to an output of an inverting gate 240, and to a control electrode of an NMOS transistor 233. A first current electrode of NMOS transistor 233 is coupled to a second current electrode of a PMOS transistor 223 and to node 272. A first current electrode of PMOS transistor 23 is coupled to the first power supply voltage VDD 217, and a second current electrode of the NMOS transistor 233 is coupled to the second power supply voltage VSS 218. An input of inverting gate 240 is coupled to an output of a NAND gate 250. A first input of NAND gate 250 is coupled to the output 214. A second input of NAND gate 250 is coupled to receive a clock signal 216. Clock signal 216 is also provided at an input of inverting gate 242. An output of inverting gate 242 is coupled to a second input of NOR gate 260. Output 214 is coupled to a second input of NOR gate 260. An output of NOR gate 260 is coupled to an input of inverting gate 241. An output of inverting gate 241 is coupled to node 278, to a control electrode of NMOS transistor 232, and to a control electrode of PMOS transistor 223. A first input of NOR gate 251 is coupled to node 272. A second input of NOR gate 251 is coupled to the output of inverting gate 242. An output of NOR gate 251 is coupled to provide the output signal 214.

In the illustrated embodiment of FIG. 5, circuit portion 290 comprises device 251; circuit portion 292 comprises devices 223 and 233; and circuit portion 294 comprises devices 221-222, 231-232, 240-242, 250, and 260. Alternate embodiments may implement the circuit portions in a different manner, and/or may use fewer or more circuit portions.

Figure 7:
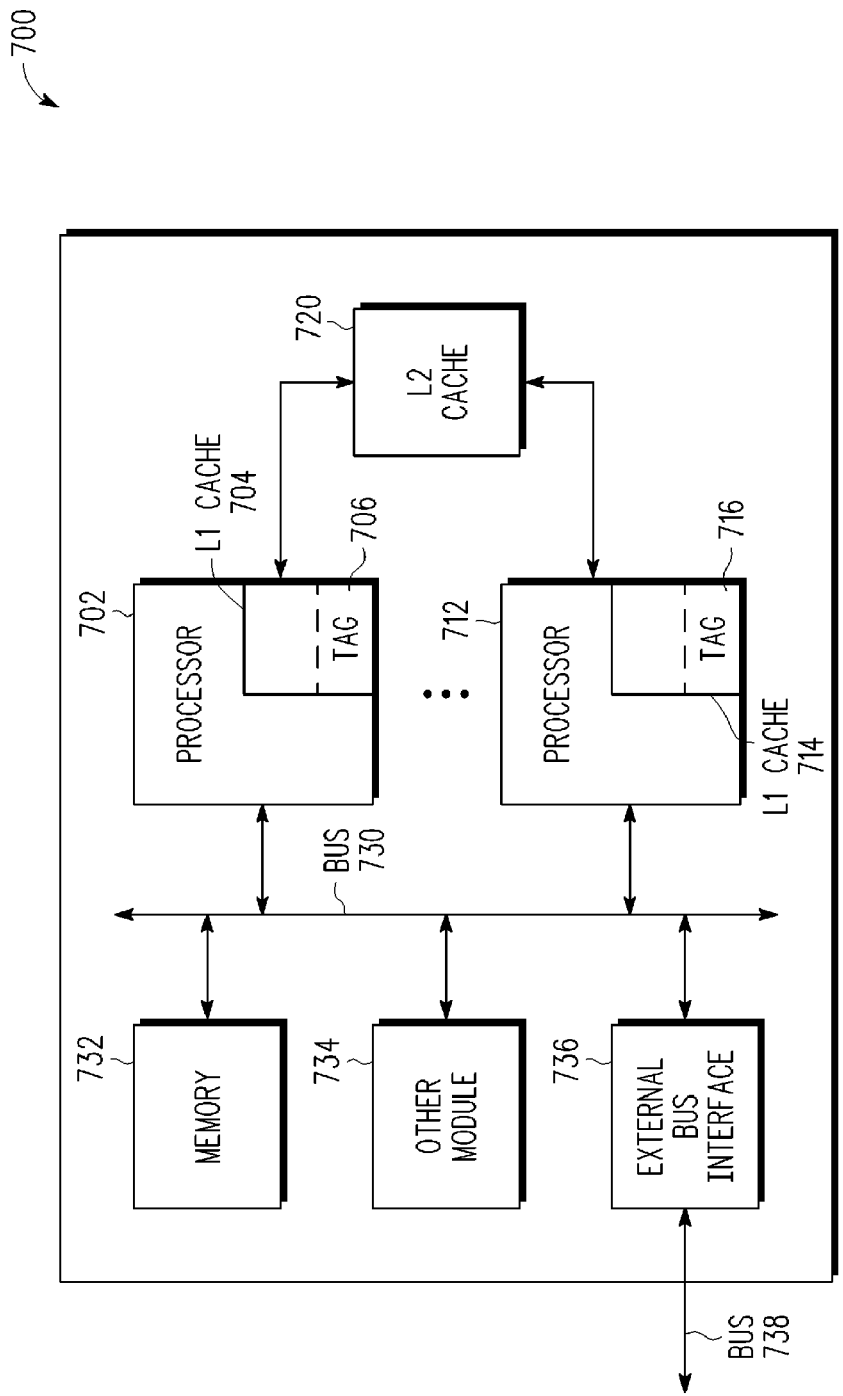
FIG. 7 illustrates, in block diagram form, an integrated circuit in accordance with one embodiment.

FIG. 7 illustrates one embodiment of an integrated circuit (IC) 700 which may use one or more of circuits 10 (see FIG. 1), 110 (see FIG. 3), and/or 210 (see FIG. 5). In the illustrated embodiment, IC 700 has a plurality of processors 702-712 which are bi-directionally coupled to memory 732, other module 734, and an external bus interface 736 by way of one or more buses 730. External bus interface 736 may be coupled external to IC 700 by way of bus 738. One or more of processors 702-712 may be bi-directionally coupled to an L2 cache 720. In one embodiment, processor 702 has an L1 cache 704, and the L1 cache 704 has tag circuitry 706. In one embodiment, processor 712 has an L1 cache 714, and the L1 cache 714 has tag circuitry 716.

In alternate embodiments, other module 734 may comprise one or more circuit blocks that perform one or more desired functions. As one possible example, other modules 734 may comprise a block of circuitry for performing timing functions, additional memory, circuitry for communicating external to IC 700, and/or any other desired functions. Memory 732 may be any type of storage circuitry for storing information. Processors 702-712 may perform any type of processing function and may use any appropriate architecture. Any one or more of circuit blocks 702-712, 732, 734, and 736 may be coupled external to IC 700 by way of one or more integrated circuit terminals (e.g. pads, pins, conducting bumps, etc.). IC 700 is merely meant to illustrate one possible embodiment of an IC that may use latching circuitry. Any IC that uses latching circuitry may use the circuitry for latching described herein.

DETAILED DESCRIPTION OF OPERATION

FIG. 1 illustrates, in partial schematic diagram and partial logic diagram form, a latch circuit 10 in accordance with one embodiment. When clock 16 is low, the output of NAND gate 51 is high, output signal 14 is low, node 76 is low, PMOS transistor 22 is conducting, NMOS transistor 33 is non-conducting, node 78 is high, NMOS transistor 32 is conducting, and PMOS transistor 23 is non-conducting. If clock 16 is low and input signal 12 is low, then node 70 is high, PMOS transistor 21 is non-conducting, and NMOS transistor 31 is conducting. With NMOS transistors 31 and 32 conducting, node 72 is low. If clock 16 is low and input signal 12 is high, then node 70 is low, PMOS transistor 21 is conducting, and NMOS transistor 31 is non-conducting. With PMOS transistors 21 and 22 conducting, node 72 is high.

When the clock transitions from low to high and input signal 12 is low, node 74 stays high, node 76 transitions from low to high, and node 78 stays high. After node 76 transitions high, PMOS transistor 22 becomes non-conducting and NMOS transistor 33 becomes conducting. After PMOS transistor 22 becomes non-conducting, a transition on input signal 12 from low to high has no effect on output 14. Thus, a low value on input signal 12 has been effectively captured and stored in latch circuit 10.

When the clock transitions from low to high and input signal 12 is high, node 74 transitions from high to low, node 76 stays low, and node 78 transitions from high to low. After node 78 transitions low, NMOS transistor 32 becomes non-conducting and PMOS transistor 23 becomes conducting. After NMOS transistor 32 becomes non-conducting, a transition on input signal 12 from high to low has no effect on output 14. Thus, a high value on input signal 12 has been effectively captured and stored in latch circuit 10. Note that in the illustrated embodiment, PMOS transistor 23 and NMOS transistor 33 act to hold node 72 at the initial value of input signal 12 when clock 16 transitions from low to high.

In the illustrated embodiment, the transitioning of node 72 due to the transitioning of input signal 12 must be complete so that the transition propagation delay of clock signal 16 (i.e. the transition on clock signal 16 to output 14) is not affected. The time duration required to complete the transition on node 72 may be considered as the setup time for input signal 12 with reference to clock signal 16. Alternately, setup time for input signal 12 with reference to clock signal 16 may be considered to be the time duration required for input data to be stable at node 72 in order to accurately capture the valid data from input signal 12.

After clock signal 16 has transitioned from low to high, there is a hold time during which the input signal 12 is required to remain stable at its present value and is not to transition. The hold time for input signal 12 remaining low is the time duration from clock signal 16 transitioning high until node 76 transitions high. The hold time for input signal 12 remaining high is the time duration from clock signal 16 transitioning high until node 78 transitions low. Note that the hold times for input signal 12 with reference to clock signal 16 are independent of the falling edge of clock signal 16.

In the embodiment illustrated in FIG. 1, dotted lines are used to partition circuit 10 into a first circuit portion 90, a second circuit portion 94, and a third circuit portion 92. Alternate embodiments may partition circuit 10 in any desired manner.

Figure 2:
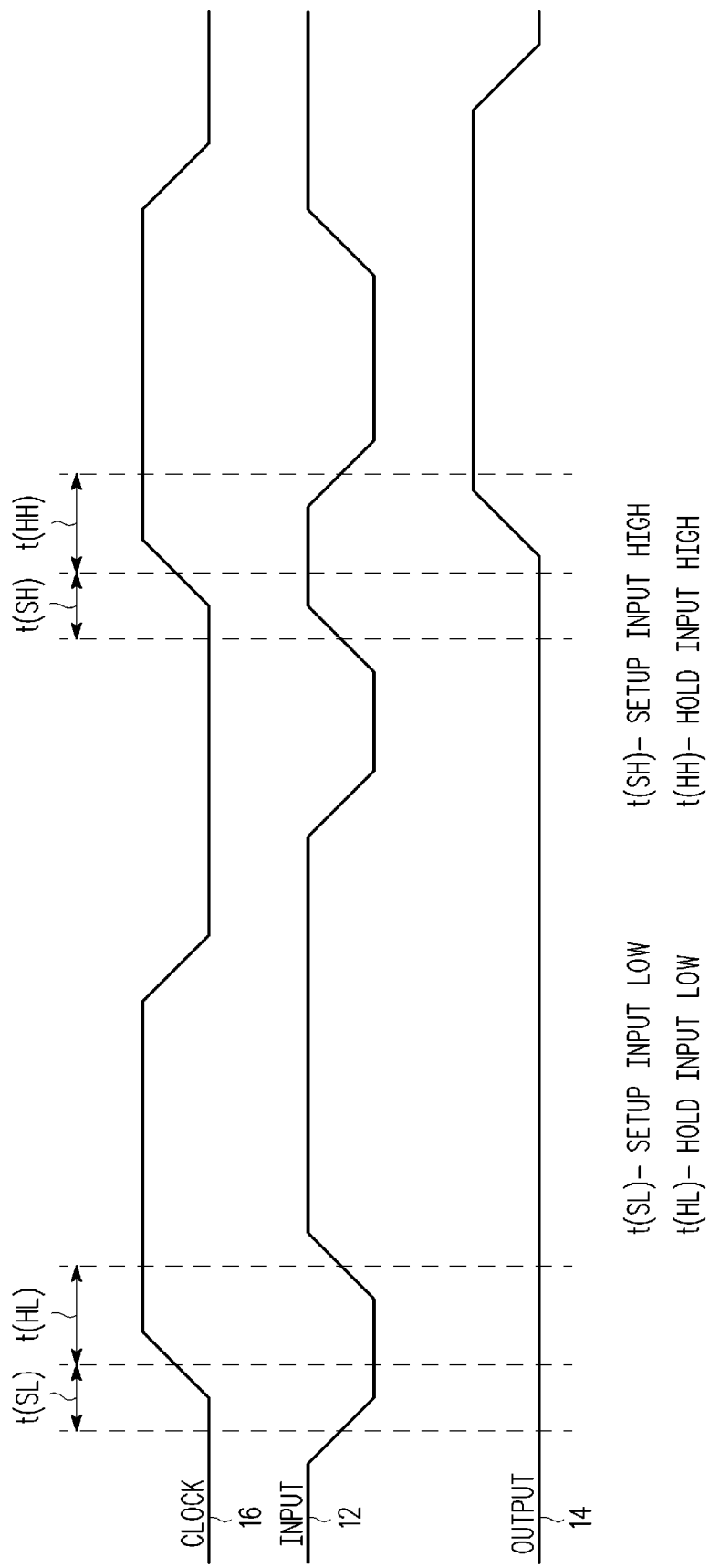
FIG. 2 illustrates, in graphical form, a timing diagram of the latch circuit of FIG. 1 in accordance with one embodiment.

FIG. 2 illustrates, in graphical form, a timing diagram of the latch circuit of FIG. 1 in accordance with one embodiment. t(SL) is the setup time for input signal 12 with reference to clock signal 16 when the input signal 12 is low. t(SH) is the setup time for input signal 12 with reference to clock signal 16 when the input signal 12 is high. t(HL) is the hold time for input signal 12 with reference to clock signal 16 when the input signal 12 is low. t(HH) is the hold time for input signal 12 with reference to clock signal 16 when the input signal 12 is high.

FIG. 3 illustrates, in partial schematic diagram and partial logic diagram form, a latch circuit 110 in accordance with an alternate embodiment. When clock 116 is low, the output of NAND gate 151 is high, output signal 114 is low, node 176 is low, PMOS transistor 122 is conducting, NMOS transistor 133 is non-conducting, node 178 is high, NMOS transistor 132 is conducting, and PMOS transistor 123 is non-conducting. If clock 116 is low and input signal 112 is low, then node 170 is high, PMOS transistor 121 is non-conducting, and NMOS transistor 131 is conducting. With NMOS transistors 131 and 132 conducting, node 172 is low. If clock 116 is low and input signal 112 is high, then node 170 is low, PMOS transistor 121 is conducting, and NMOS transistor 131 is non-conducting. With PMOS transistors 121 and 122 conducting, node 172 is high.

When the clock transitions from low to high and input signal 112 is low, node 174 stays high, node 176 transitions from low to high, and node 178 stays high. After node 176 transitions high, PMOS transistor 122 becomes non-conducting and NMOS transistor 133 becomes conducting. After PMOS transistor 122 becomes non-conducting, a transition on input signal 112 from low to high has no effect on output 114. Thus, a low value on input signal 112 has been effectively captured and stored in latch circuit 110.

When the clock transitions from low to high and input signal 112 is high, node 174 transitions from high to low, node 176 stays low, and node 178 transitions from high to low. After node 178 transitions low, NMOS transistor 132 becomes non-conducting and PMOS transistor 123 becomes conducting. After NMOS transistor 132 becomes non-conducting, a transition on input signal 112 from high to low has no effect on output 114. Thus, a high value on input signal 112 has been effectively captured and stored in latch circuit 110. Note that in the illustrated embodiment, PMOS transistor 123 and NMOS transistor 133 act to hold node 172 at the initial value of input signal 112 when clock 116 transitions from low to high.

In the illustrated embodiment, the transitioning of node 172 due to the transitioning of input signal 112 must be complete so that the transition propagation delay of clock signal 116 (i.e. the transition on clock signal 116 to output 114) is not affected. The time duration required to complete the transition on node 172 may be considered as the setup time for input signal 112 with reference to clock signal 116. Alternately, setup time for input signal 112 with reference to clock signal 116 may be considered to be the time duration required for input data to be stable at node 172 in order to accurately capture the valid data from input signal 112.

After clock signal 116 has transitioned from low to high, there is a hold time during which the input signal 112 is required to remain stable at its present value and is not to transition. The hold time for input signal 12 remaining low is the time duration from clock signal 116 transitioning high until node 176 transitions high. The hold time for input signal 112 remaining high is the time duration from clock signal 116 transitioning high until node 178 transitions low. Note that the hold times for input signal 112 with reference to clock signal 116 are independent of the falling edge of clock signal 116.

In the embodiment illustrated in FIG. 3, dotted lines are used to partition circuit 110 into a first circuit portion 190, a second circuit portion 194, and a third circuit portion 192. Alternate embodiments may partition circuit 110 in any desired manner.

Figure 4:
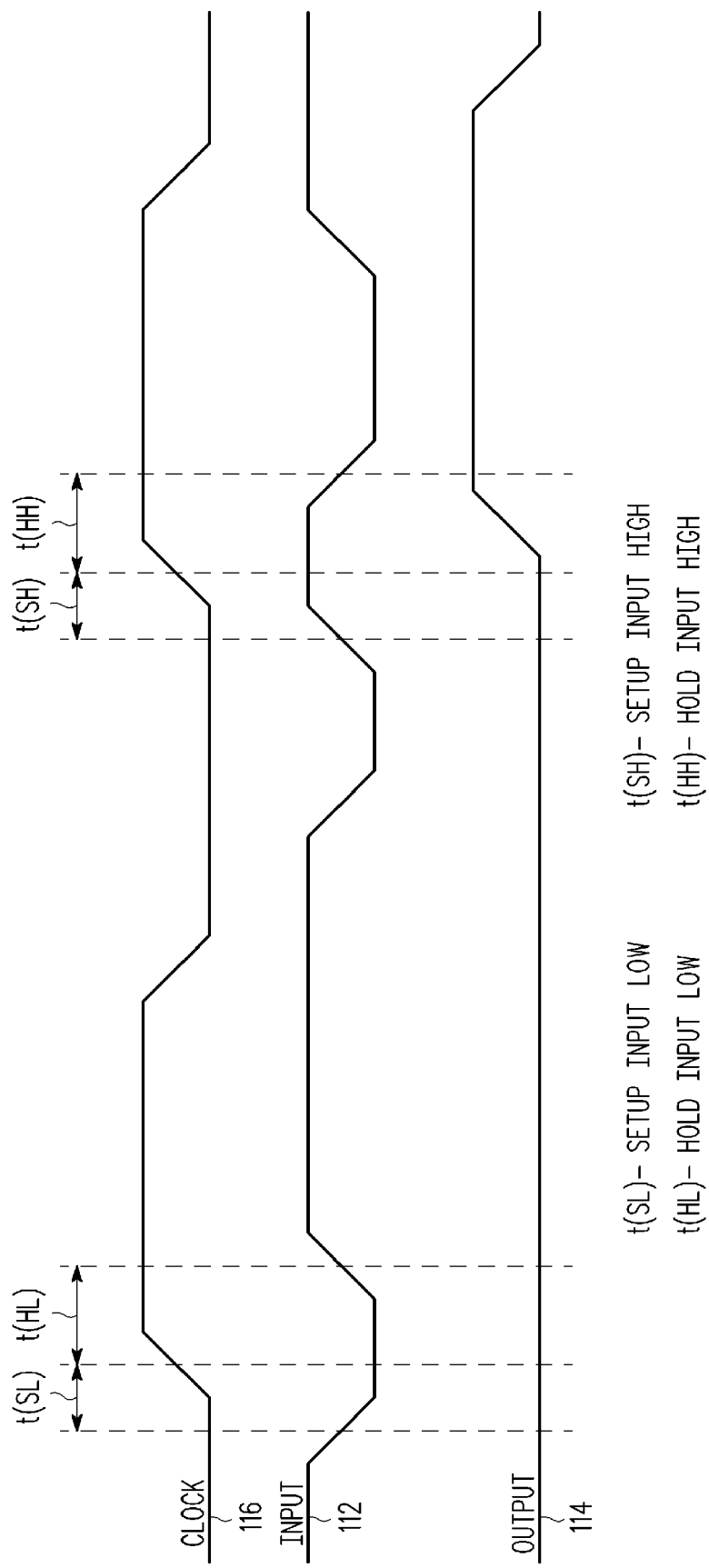
FIG. 4 illustrates, in graphical form, a timing diagram of the latch circuit of FIG. 3 in accordance with an alternate embodiment.

FIG. 4 illustrates, in graphical form, a timing diagram of the latch circuit of FIG. 3 in accordance with one embodiment. t(SL) is the setup time for input signal 112 with reference to clock signal 116 when the input signal 112 is low. t(SH) is the setup time for input signal 112 with reference to clock signal 116 when the input signal 112 is high. t(HL) is the hold time for input signal 112 with reference to clock signal 116 when the input signal 112 is low. t(HH) is the hold time for input signal 112 with reference to clock signal 116 when the input signal 112 is high.

FIG. 5 illustrates, in partial schematic diagram and partial logic diagram form, a latch circuit 210 in accordance with one embodiment. When clock 216 is low, node 280 is high, the output of NOR gate 251 is low, output signal 214 is low, node 276 is low, PMOS transistor 222 is conducting, NMOS transistor 233 is non-conducting, node 278 is high, NMOS transistor 232 is conducting, and PMOS transistor 223 is non-conducting. If clock 216 is low and input signal 212 is low, then PMOS transistor 221 is conducting, and NMOS transistor 231 is non-conducting. With PMOS transistors 231 and 232 conducting, node 272 is high. If clock 216 is low and input signal 212 is high, then PMOS transistor 221 is non-conducting and NMOS transistor 231 is conducting. With NMOS transistors 231 and 232 conducting, node 272 is low.

When the clock transitions from low to high and input signal 212 is low, output signal 214 stays low, node 276 stays low, and node 278 transitions from high to low. After node 278 transitions low, PMOS transistor 223 becomes conducting and NMOS transistor 232 becomes non-conducting. After NMOS transistor 232 becomes non-conducting, a transition on input signal 212 from low to high has no effect on output 214. Thus, a low value on input signal 212 has been effectively captured and stored in latch circuit 210.

When the clock transitions from low to high and input signal 212 is high, output signal 214 transitions from low to high, node 278 stays high, and node 276 transitions from low to high. After node 276 transitions high, NMOS transistor 233 becomes conducting and PMOS transistor 222 becomes non-conducting. After PMOS transistor 222 becomes non-conducting, a transition on input signal 212 from high to low has no effect on output 214. Thus, a high value on input signal 212 has been effectively captured and stored in latch circuit 210. Note that in the illustrated embodiment, PMOS transistor 223 and NMOS transistor 233 act to hold node 272 at the initial value of input signal 212 when clock 216 transitions from low to high.

In the illustrated embodiment, the transitioning of node 272 due to the transitioning of input signal 212 must be complete so that the transition propagation delay of clock signal 216 (i.e. the transition on clock signal 216 to output 214) is not affected. The time duration required to complete the transition on node 272 may be considered as the setup time for input signal 212 with reference to clock signal 216. Alternately, setup time for input signal 212 with reference to clock signal 216 may be considered to be the time duration required for input data to be stable at node 272 in order to accurately capture the valid data from input signal 212.

After clock signal 216 has transitioned from low to high, there is a hold time during which the input signal 212 is required to remain stable at its present value and is not to transition. The hold time for input signal 212 remaining low is the time duration from clock signal 216 transitioning high until node 278 transitions low. The hold time for input signal 212 remaining high is the time duration from clock signal 216 transitioning high until node 276 transitions high. Note that the hold times for input signal 212 with reference to clock signal 216 are independent of the falling edge of clock signal 216.

In the embodiment illustrated in FIG. 5, dotted lines are used to partition circuit 210 into a first circuit portion 290, a second circuit portion 294, and a third circuit portion 292. Alternate embodiments may partition circuit 210 in any desired manner.

Figure 6:
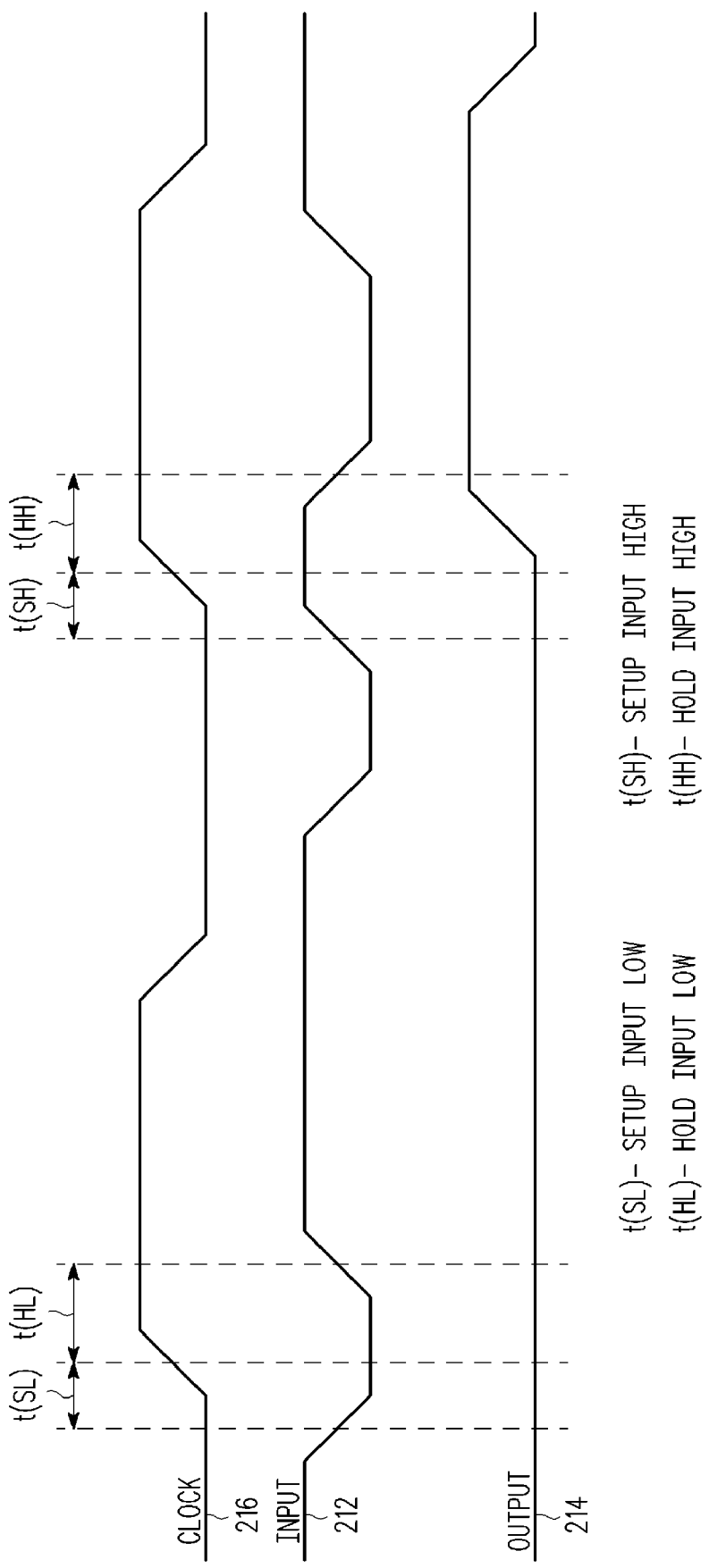
FIG. 6 illustrates, in graphical form, a timing diagram of the latch circuit of FIG. 5 in accordance with an alternate embodiment.

FIG. 6 illustrates, in graphical form, a timing diagram of the latch circuit of FIG. 5 in accordance with one embodiment. t(SL) is the setup time for input signal 212 with reference to clock signal 216 when the input signal 212 is low. t(SH) is the setup time for input signal 212 with reference to clock signal 216 when the input signal 212 is high. t(HL) is the hold time for input signal 212 with reference to clock signal 216 when the input signal 212 is low. t(HH) is the hold time for input signal 212 with reference to clock signal 216 when the input signal 212 is high.

FIG. 7 illustrates, in block diagram form, an integrated circuit 700 in accordance with one embodiment. In the illustrated embodiment, one or more latch circuits 10, 110, and/or 210 may be used in the tag portion 706 of L1 cache 704. Likewise, in the illustrated embodiment, one or more latch circuits 10, 110, and/or 210 may be used in the tag portion 716 of L1 cache 714. Latch circuits such as 10, 110, and 210 may be useful in the tag portion of a cache due to there being a plurality of circuits that may be the source of the input signal to the latch circuits 10, 110, and 210. It may be advantageous in cache tag circuits for the hold time for the input signal with reference to the control signal to be independent of the falling edge of the control signal. This independence allows the input signal to be sourced by a plurality of different circuits that may have different timing.

Alternate embodiments may use the latch circuits 10, 110, and/or 210 in any desired manner and in any desired circuitry. The use of latch circuits 10, 110, and/or 210 in a cache tag (e.g. 706, 716 of FIG. 7) is just one possible use of latch circuits 10, 110, and/or 210. Note that latch circuits 10, 110, and/or 210 may be used as the input latch for any dynamic circuit, register file memories, or any other appropriate circuit block. For example, latch circuits 10, 110, and/or 210 may be used to drive a wordline in a memory (e.g. memory 732 of FIG. 7). Referring to FIG. 1, if latch circuit 10 is used to drive a wordline, the inverter formed by transistors 20 and 30 may be modified to be a suitable logic gate or combination of logic gates (e.g. NAND gate, NOR gate, inverter).

Note that for the embodiments of latch circuits 10, 110, 210 illustrated in the figures, the output signal 14, 114, 214 is reset to a low value after the clock signal 16, 116, 218 transitions low. This effectively resets the output of the latch. PMOS transistors 23, 123, 223 and NMOS transistors 33, 133, 233 do not perform a holding function for their respective input signal 12, 112, 212 when their respective clock signal 16, 116, 216 is low.

In alternate embodiments, the latch circuits 10, 110, and/or 210 may be implemented using circuitry having an opposite polarity. This may result in latch circuits that effectively reset the output of the latch to high.

Note that for the embodiments of latch circuits 10, 110, 210 illustrated in the figures, the input signal 12, 112, 212 is setup and held with regard to the rising edge of the clock signal 16, 116, 216. This effectively makes the hold time independent of the falling edge of clock signal 16, 116, 216. In alternate embodiments, the latch circuits 10, 110, and/or 210 may be implemented such that the input signal 12, 112, 212 is setup and held with regard to the falling edge of the clock signal 16, 116, 216. This effectively makes the hold time independent of the rising edge of clock signal 16, 116, 216. For example, in FIG. 1 adding an inverter (not shown) to the input of clock signal 16, adding an inverter (not shown) at the clock input of NAND gate 50, and removing inverter 42 would produce a latch circuit that is setup and held with regard to the falling edge of the clock signal. Similar modifications can be made to the embodiment of latch circuit 110 illustrated in FIG. 3, and to the embodiment of latch circuit 210 illustrated in FIG. 5. As can be seen, a wide variety of alternate embodiments is possible. As another example, referring to FIG. 5, inverter 242 may be removed and an inverter (not shown) may be added to the clock input of NAND gate 250.

In some embodiments, what is important is that the setup time of the input signal is dependent on a first edge (e.g. rising edge) of a clock signal while the hold time of the input signal is independent of the second edge (e.g. falling edge) of the clock signal. This relationship allows a plurality of source circuits to provide the input signal, where the timing in the plurality of source circuits may be different from each other.

Note that the latch circuits 10, 110, and 210 may receive their input signal 12, 112, 212 from one or more static or dynamic circuits, and may provide their output signal 14, 114, 214 to one or more static or dynamic circuits.

Note that for the embodiment illustrated in FIG. 1, a clock signal 16 is used as a control signal, for the embodiment illustrated in FIG. 3, a clock signal 116 is used as a control signal, and for the embodiment illustrated in FIG. 5, a clock signal 216 is used as a control signal. In alternate embodiments, one or more of clock signals 16, 116, and 216 may be replaced with one or more control signals that are not clock signals.

ADDITIONAL TEXT

Statement 1. A method for latching an input signal, the method comprising:
providing an output signal;
providing a control signal having a first edge and a second edge; and
providing the input signal, wherein the input signal is setup with reference to the control signal, and wherein the input signal is held with reference to the control signal, wherein the setup of the input signal with reference to the control signal is to the first edge of the control signal, wherein the holding of the input signal with reference to the control signal is independent of the second edge of the control signal, and
wherein the output signal goes to a predetermined state in response to the second edge of the control signal.

Statement 2. A method as in statement 1, wherein the predetermined state comprises a reset state.

Statement 3. A method as in statement 1, wherein the control signal comprises a clock signal.

Statement 4. A method as in statement 1, wherein when the control signal is asserted and the input signal is low, the input signal is allowed through to affect the output signal, and wherein when the control signal is asserted and the input signal is high, the input signal is not allowed through to affect the output signal.

Statement 5. A method as in statement 1, wherein when the control signal is asserted, the output signal is held approximately constant by a holding circuit.

Statement 6. A method as in statement 5, wherein when the control signal is negated, the output signal goes to the predetermined state.

Statement 7. A method as in statement 6, wherein when the control signal is negated, the output signal is no longer held at the predetermined state by the holding circuit.

Statement 8. A method as in statement 1, wherein the input signal has a hold time, and wherein during the hold time of the input signal the input signal is to remain transitionless, and wherein the hold time comprises a low hold time for the input signal remaining low, and a high hold time for the input signal remaining high.

Statement 9. A method as in statement 8, wherein the low hold time and the high hold time are different.

Statement 10. A latch circuit having a first input for receiving an input signal, having a second input for receiving a control signal, and having an output for providing an output signal, the latch circuit comprising:
a first circuit portion (90) for gating the input signal to the output of the latch when the control signal is negated;
a second circuit portion (94) coupled to the first circuit portion, the second circuit portion receives the input signal and selectively gates the input signal to the first circuit portion when the control signal is asserted; and
a third circuit portion (92) coupled to the first circuit portion, said third circuit portion holding the input value for the first circuit portion when the control signal is asserted.

Statement 11. A latch circuit as in statement 10, wherein the first circuit portion comprises:
a NAND gate having an output; and
an inverter, having an input coupled to the output of the NAND gate, and having an output for providing the output signal.

Statement 12. A latch circuit as in statement 10, wherein the first circuit portion comprises:
a NOR gate having an output for providing the output signal.

Statement 13. A latch circuit as in statement 10, wherein the third circuit portion comprises:
a p-channel device having a first current electrode coupled to the first circuit portion; and
an n-channel device having a first current electrode coupled to the first current electrode of the p-channel device.

Statement 14. A latch circuit as in statement 10, wherein the second circuit portion allows the input signal through to affect the output signal when the control signal is asserted and the input signal is low, and wherein the second circuit portion prevents the input signal from affecting the output signal when the control signal is asserted and the input signal is high.

Statement 15. A latch circuit as in statement 10, wherein the third circuit portion holds an input value of the input signal for the first circuit portion when the control signal is asserted, and the third circuit portion does not hold the input value of the input signal for the first circuit portion when the control signal is negated.

Statement 16. A latch circuit as in statement 10, wherein when the control signal is asserted, selective gating by the second circuit portion is dependent upon an input value of the input signal.

Statement 17. A latch circuit having a first input for receiving an input signal, having a second input for receiving a control signal, and having an output for providing an output signal, the latch circuit comprising:
a first PMOS transistor (21, 121, 221) having a first current electrode, having a control electrode coupled to receive the first input signal, and having a second current electrode;
a first NMOS transistor (31, 131, 231) having a first current electrode coupled to the second current electrode of the first PMOS transistor and coupled to a first node (72, 172, 272), having a control electrode coupled to receive the first input signal, and having a second current electrode;
a second PMOS transistor (22, 122, 222) having a first current electrode coupled to a first power supply voltage (VDD), having a control electrode coupled to a second node (76, 176, 276), and having a second current electrode coupled to the first current electrode of the first PMOS transistor;
a second NMOS transistor (32, 132, 232) having a first current electrode coupled to the second current electrode of the first NMOS transistor, having a control electrode coupled to a third node (78, 178, 278), and having a second current electrode coupled to a second power supply voltage (VSS);

a third PMOS transistor (23, 123, 223) having a first current electrode coupled to the first power supply voltage (VDD), having a control electrode coupled to the third node, and having a second current electrode coupled to the first node;

a third NMOS transistor (33, 133, 233) having a first current electrode coupled to the first node, having a control electrode coupled to the second node, and having a second current electrode coupled to the second power supply voltage (VSS);

a first circuit portion (40, 50) (141, 142, 144) (240, 250) coupled to the output of the latch circuit for receiving the output signal, coupled to the second input of the latch circuit for receiving the control signal, and coupled to the second node;

a second circuit portion (90, 190, 290) having an output coupled to the output of the latch circuit; and a third circuit portion (41, 42, 60) (140, 150) (241, 242, 260) having an input coupled to the second input of the latch circuit for receiving the control signal, and having an output coupled to the third node.

Statement 18. A latch circuit as in statement 17, wherein the control signal comprises a clock signal.

Statement 19. A latch circuit as in statement 17, wherein the latch circuit is used in a cache tag.

Statement 20. An integrated circuit comprising the latch circuit as in statement 17.

It should be understood that all circuitry described herein may be implemented either in silicon or another semiconductor material or alternatively by software code representation of silicon or another semiconductor material.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for latching an input signal, the method comprising:

providing an output signal;

providing a control signal having a first edge and a second edge; and providing the input signal, wherein the input signal is setup with reference to the control signal, and wherein the input signal is held with reference to the control signal, wherein the setup of the input signal with reference to the control signal is to the first edge of the control signal, wherein the holding of the input signal with reference to the control signal is independent of the second edge of the control signal, and wherein the output signal goes to a predetermined state in response to the second edge of the control signal.

2. A method as in claim 1, wherein the predetermined state comprises a reset state.

3. A method as in claim 1, wherein the control signal comprises a clock signal.

4. A method as in claim 1, wherein when the control signal is asserted and the input signal is low, the input signal is allowed through to affect the output signal, and wherein when the control signal is asserted and the input signal is high, the input signal is not allowed through to affect the output signal.

5. A method as in claim 1, wherein when the control signal is asserted, the output signal is held approximately constant by a holding circuit.

6. A method as in claim 5, wherein when the control signal is negated, the output signal goes to the predetermined state.

7. A method as in claim 6, wherein when the control signal is negated, the output signal is no longer held at the predetermined state by the holding circuit.

8. A method as in claim 1, wherein the input signal has a hold time, and wherein during the hold time of the input signal the input signal is to remain transitionless, and wherein the hold time comprises a low hold time for the input signal remaining low, and a high hold time for the input signal remaining high.

9. A method as in claim 8, wherein the low hold time and the high hold time are different.

10. A latch circuit having a first input for receiving an input signal, having a second input for receiving a control signal wherein the control signal has a first edge and a second edge, and having an output for providing an output signal, the latch circuit comprising:

a first circuit portion (90) for gating the input signal to the output of the latch when the control signal is negated;

a second circuit portion (94) coupled to the first circuit portion, the second circuit portion receives the input signal and selectively gates the input signal to the first circuit portion when the control signal is asserted; and a third circuit portion (92) coupled to the first circuit portion, said third circuit portion holding the input value for the first circuit portion when the control signal is asserted, wherein the output signal goes to a predetermined state in response to the second edge of the control signal, and wherein a hold time for the input signal with reference to the control signal is independent of the second edge of the control signal.

11. A latch circuit as in claim 10, wherein the first circuit portion comprises:

a NAND gate having an output; and an inverter, having an input coupled to the output of the NAND gate, and having an output for providing the output signal.

12. A latch circuit as in claim 10, wherein the first circuit portion comprises:

a NOR gate having an output for providing the output signal.

13. A latch circuit as in claim 10, wherein the third circuit portion comprises:

a p-channel device having a first current electrode coupled to the first circuit portion; and an n-channel device having a first current electrode coupled to the first current electrode of the p-channel device.

14. A latch circuit as in claim 10, wherein the second circuit portion allows the input signal through to affect the output signal when the control signal is asserted and the input signal is low, and wherein the second circuit portion prevents the input signal from affecting the output signal when the control signal is asserted and the input signal is high.

15. A latch circuit as in claim 10, wherein the third circuit portion holds an input value of the input signal for the first circuit portion when the control signal is asserted, and the third circuit portion does not hold the input value of the input signal for the first circuit portion when the control signal is negated.

16. A latch circuit as in claim 10, wherein when the control signal is asserted, selective gating by the second circuit portion is dependent upon an input value of the input signal.

17. A latch circuit having a first input for receiving an input signal, having a second input for receiving a control signal, and having an output for providing an output signal, the latch circuit comprising:
- a first PMOS transistor (21, 121, 221) having a first current electrode, having a control electrode coupled to receive the first input signal, and having a second current electrode;
- a first NMOS transistor (31, 131, 231) having a first current electrode coupled to the second current electrode of the first PMOS transistor and coupled to a first node (72, 172, 272), having a control electrode coupled to receive the first input signal, and having a second current electrode;
- a second PMOS transistor (22, 122, 222) having a first current electrode coupled to a first power supply voltage (VDD), having a control electrode coupled to a second node (76, 176, 276), and having a second current electrode coupled to the first current electrode of the first PMOS transistor;
- a second NMOS transistor (32, 132, 232) having a first current electrode coupled to the second current electrode of the first NMOS transistor, having a control electrode coupled to a third node (78, 178, 278), and having a second current electrode coupled to a second power supply voltage (VSS);
- a third PMOS transistor (23, 123, 223) having a first current electrode coupled to the first power supply voltage (VDD), having a control electrode coupled to the third node, and having a second current electrode coupled to the first node;
- a third NMOS transistor (33, 133, 233) having a first current electrode coupled to the first node, having a control electrode coupled to the second node, and having a second current electrode coupled to the second power supply voltage (VSS);
- a first circuit portion (40, 50) (141, 142, 144) (240, 250) coupled to the output of the latch circuit for receiving the output signal, coupled to the second input of the latch circuit for receiving the control signal, and coupled to the second node;
- a second circuit portion (90, 190, 290) having an output coupled to the output of the latch circuit; and
- a third circuit portion (41, 42, 60) (140, 150) (241, 242, 260) having an input coupled to the second input of the latch circuit for receiving the control signal, and having an output coupled to the third node.

18. A latch circuit as in claim 17, wherein the control signal comprises a clock signal.

19. A latch circuit as in claim 17, wherein the latch circuit is used in a cache tag.

20. An integrated circuit comprising the latch circuit as in claim 17.

* * * * *